(12) United States Patent
DePaso

(10) Patent No.: US 8,997,973 B2
(45) Date of Patent: Apr. 7, 2015

(54) CONVEYOR SYSTEM, BELT, AND METHOD FOR MEASURING AND CONTROLLING STATIC ELECTRICITY

(75) Inventor: Joseph M. DePaso, River Ridge, LA (US)

(73) Assignee: Laitram, L.L.C., Harahan, LA (US)

( * ) Notice: Subject to any disclaimer, the term of this patent is extended or adjusted under 35 U.S.C. 154(b) by 109 days.

(21) Appl. No.: 13/880,691

(22) PCT Filed: Oct. 13, 2011

(86) PCT No.: PCT/US2011/056190
§ 371 (c)(1),
(2), (4) Date: May 1, 2013

(87) PCT Pub. No.: WO2012/054304
PCT Pub. Date: Apr. 26, 2012

(65) Prior Publication Data
US 2014/0144756 A1   May 29, 2014

Related U.S. Application Data

(60) Provisional application No. 61/405,705, filed on Oct. 22, 2010.

(51) Int. Cl.
*B65G 47/92* (2006.01)
*H05F 3/00* (2006.01)
*B65G 43/00* (2006.01)
*B65G 15/30* (2006.01)

(52) U.S. Cl.
CPC *H05F 3/00* (2013.01); *B65G 43/00* (2013.01); *B65G 2207/10* (2013.01); *B65G 15/30* (2013.01)

(58) Field of Classification Search
CPC .............. B65G 2301/5132; B65G 2301/5133; B65G 3/18
USPC .......... 198/841, 837, 831; 355/401; 324/452, 324/457; 399/50
See application file for complete search history.

(56) References Cited

U.S. PATENT DOCUMENTS

| | | | |
|---|---|---|---|
| 2,576,882 A | 11/1951 | Koole et al. | |
| 3,870,968 A * | 3/1975 | Vosteen et al. | 330/298 |
| 4,205,257 A * | 5/1980 | Oguro et al. | 315/39.69 |
| 4,853,639 A * | 8/1989 | Vosteen et al. | 324/457 |
| 5,243,383 A * | 9/1993 | Parisi | 399/50 |
| 5,317,476 A | 5/1994 | Wallace et al. | |
| 5,754,918 A | 5/1998 | Mestha et al. | |
| 6,225,809 B1 | 5/2001 | Watano et al. | |
| 6,320,387 B1 * | 11/2001 | Abramsohn et al. | 324/452 |
| 6,490,979 B1 | 12/2002 | Pfleger et al. | |
| 2004/0084287 A1 | 5/2004 | Nesdahl | |
| 2005/0002145 A1 | 1/2005 | Elon | |
| 2009/0152173 A1 | 6/2009 | Miller et al. | |
| 2009/0194391 A1 | 8/2009 | Lagneaux | |

* cited by examiner

*Primary Examiner* — James R Bidwell
(74) *Attorney, Agent, or Firm* — James T. Cronvich

(57) ABSTRACT

Conveying systems and method for detecting the presence of static electric charge on a conveyor. The conveyor system includes a conveyor with an outer conveying surface. Embedded or external static-electricity sensors make measurements of static electricity on the belt's conveying surface. A controller uses the measurements to control the level of electric charges on the belt by transferring charge to or from the belt.

31 Claims, 2 Drawing Sheets

CONVEYOR SYSTEM, BELT, AND METHOD FOR MEASURING AND CONTROLLING STATIC ELECTRICITY

BACKGROUND

The invention relates generally to power-driven conveyors conveying articles and more particularly to conveyor systems using static-electricity detectors to detect the electric charge on a conveyor conveying articles.

Many articles being conveyed on a transport surface must be maintained at, above, or below a specified static charge level. Examples include sensitive electronic devices that must be protected from excessive charge or discharge gradients and articles that must be charged for a specific purpose, such as for the electrostatic deposition of coatings. Typically, conveyors transporting static-sensitive articles include conductive coatings or constituents that dissipate electric charges or prevent them from building up. But adding conductive coatings or constituents alone to a conveyor belt cannot control the static level in the belt for variable ambient and production conditions. For articles that are sensitive to high static levels, or articles that must be charged, not sensing and controlling the conveyor surface static charge level can affect the quality of the product or the process.

SUMMARY

One version of a conveyor system embodying features of the invention comprises a conveyor conveying articles in a conveying direction. The conveyor has a conveying surface that supports the articles being conveyed in the conveying direction. A static-electricity detector is operative to make measurements of the static electricity due to the electric charge of the conveyor.

In another aspect of the invention, a conveyor belt comprises a conveying surface for supporting articles and a static-electricity detector operative to make measurements of the static electricity due to electric charges on the conveying surface.

In yet another aspect of the invention, a method for controlling the amount of charge on a conveyor comprises: (a) making measurements of the amount of electric charge on a conveyor; and (b) transferring electric charges to or from the conveyor as a function of the measurement.

BRIEF DESCRIPTION OF THE DRAWINGS

These aspects and features of the invention are better understood by referring to the following description, appended claims, and accompanying drawings, in which:

DETAILED DESCRIPTION

Figure 1:
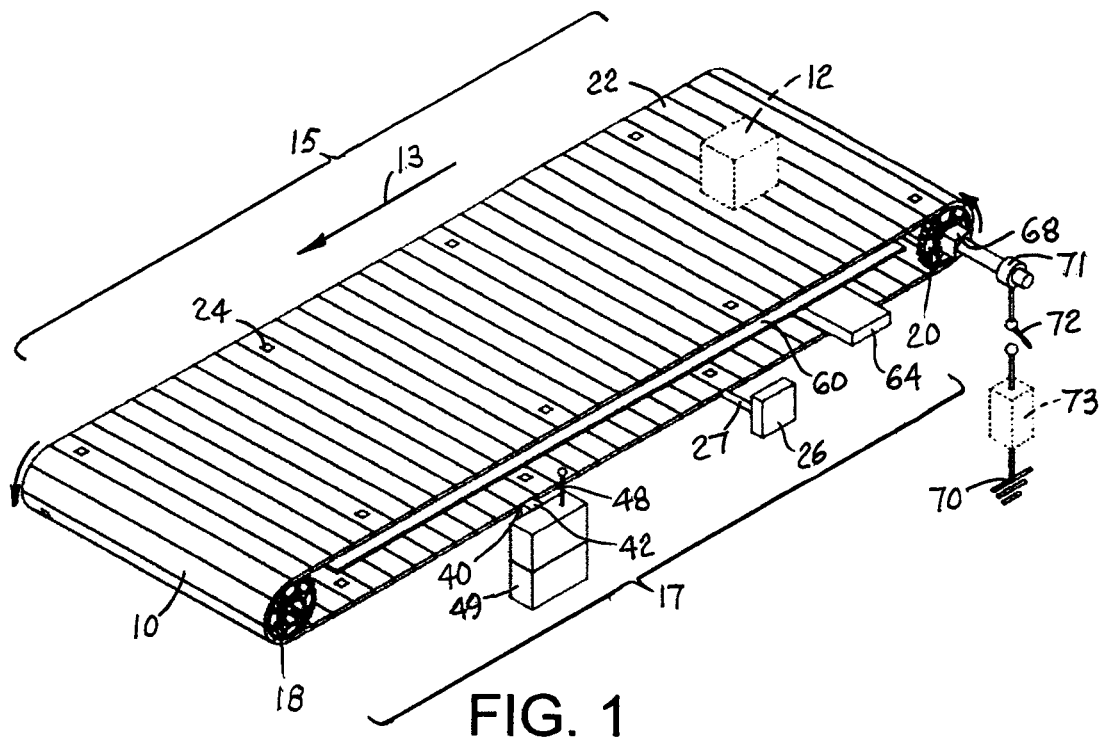
FIG. 1 is an isometric view of a conveyor system embodying features of the invention including static-electricity sensors.

One version of a conveyor system embodying features of the invention is shown in FIG. 1. A conveyor, shown in this example as a conveyor belt 10, carries articles 12 in a conveying direction 13 on an outer conveying surface 22 along a carryway segment 15 of the belt's endless conveyor path. For example, the conveyor belt 10 may carry articles such as electronic components or devices or items to be coated by electrostatic deposition along the carryway 15. At the end of the carryway, the articles are conveyed off the conveyor belt. After rounding drive sprockets 18, the conveyor belt 10 follows a return segment 17 on its way back around idle sprockets 20 to the carryway segment 15.

One or more static-electricity detectors 24 disposed in or on the belt 10 are set to detect the level of the electric charge on or in the conveying surface 22. In this example, which shows a modular plastic conveyor belt constructed of rows of hinged modules, the static-electricity detectors 24 are shown at spaced apart locations along the length of the belt and across its width.

The material of the belt itself can be selected based on the triboelectric potential desired between the conveyor belt 10 and the conveyed material or product. Polymer materials are the base materials of modular plastic conveyor belts, which generally tend to acquire a moderate to strong negative charge. Polymer belts are typically good insulators but can be made slightly conductive via the addition of conductivity agents such as carbon. A polymer belt can be made to generate and if properly isolated, hold a significant static charge, usually negative.

A static charge can be generated in the conveyor belt 10 simply by allowing the belt to slide over a carryway surface 60. The rubbing, or frictional, contact transfers charge to the belt. Often the generation of such a charge is a normal consequence of the conveyor design. If an enhanced charge potential is desired, the charge can be maximized by selecting a carryway material distant from the belt material in the triboelectric series. By using the same materials for belt and carryway, the transfer of charge can be lessened. Additionally or alternatively, a stationary secondary charge generator 26 external to the conveyor belt can be used to transfer charges to the belt over a contact 27. Examples of charge generators include friction machines using the triboelectric effect, influence machines using electrostatic induction, and Van de Graaff generators. Passive rubbing contact and an active charge generator are just two means for transferring electric charge to the belt's conveying surface.

Figure 2:
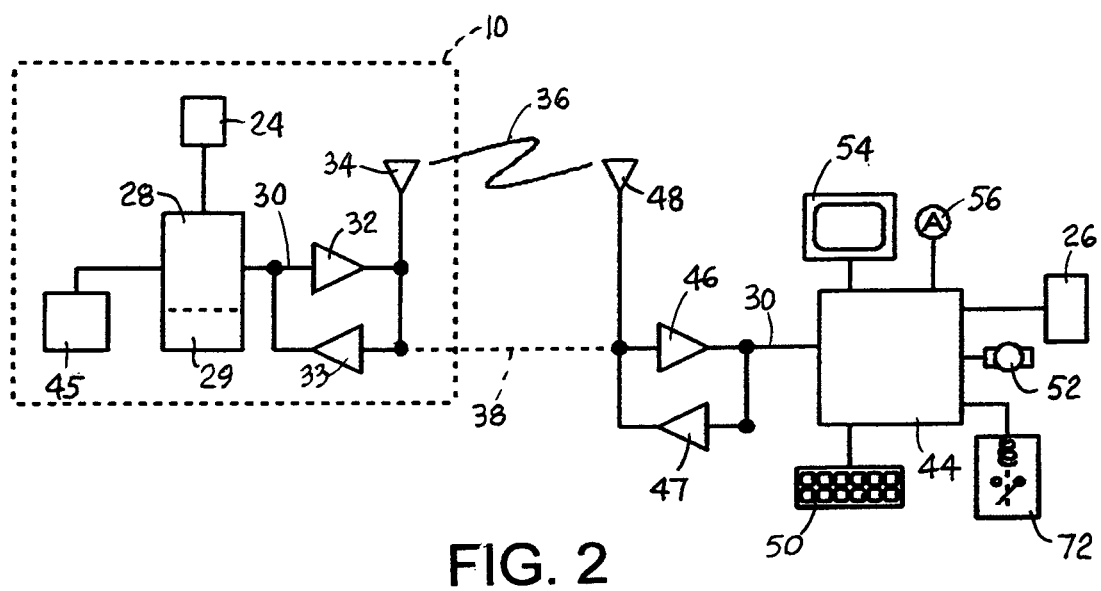
FIG. 2 is a block diagram of the conveyor system of FIG. 1.

As shown in FIG. 2, each static-electricity detector is connected to a logic circuit 28 in the conveyor belt 10. Each logic circuit may be realized by a programmed microcontroller or by hardwired logic elements. Conventional signal-conditioning circuit components, such as buffers, amplifiers, analog-to-digital converters, and multiplexers, may be interposed between the static-electricity detectors and the logic circuit. The logic circuit may also include a unique address or other identifying indicia to correlate the response of each static-electricity detector with a specific detector position on the conveyor belt. The identifying indicia and the static-electricity detector's response may be stored in one or more memory elements 29. The static-electricity detector, which may include an integral or an external transducer, produces a response that is converted into a static-electricity measurement signal 30 that is transmitted remotely by a transmitter 32. The transmitter may be a wireless RF transmitter transmitting wirelessly via an antenna 34 over a wireless communication link 36 or over an ohmic connection 38 between a conductive contact 40 on the outside of the belt 10 and a brush 42 in conveyor structure along the side of the belt, as in FIG. 1. A receiver 33 may also be connected to the logic circuit to receive command and control signals from a remote controller 44, i.e., a controller not located on or in the conveyor belt. Other transmitter-receiver technologies, such as optical or infrared, for example, may be used. All the components embedded in the belt may be powered by a power source 45, such as one or more battery cells, housed together in a cavity in the belt. Alternatively, the power source 45 may be an energy harvester harvesting energy from vibratory motion or articulation of the conveyor, thermal gradients, or other energy-producing effects inherent in the process or conveyance. The embedded power source 45 may alternatively be powered by induction or by RF charging as it recirculates past an external charging device 49, as in FIG. 1.

A remote receiver 46 receives the measurement signal 30 via an antenna 48 over the wireless communication link 36 or over the ohmic connection 38 from the receiver 33 embedded in the conveyor belt. The receiver 46 sends the measurement signal 30 to the remote controller 44. A transmitter 47 connected between the controller 44 and the antenna 48 or the ohmic connection 38 may be used to send command and control signals to the belt-borne static-electricity detector circuits. An operator input device 50 connected to the controller 44 may be used to select static-electricity detector or alarm settings or displayed data. From the settings and the detector's response to, for example, the level of charge on the outer surface of the belt, the controller adjusts the secondary charge generator 26 to add charge to the belt. The controller 44 may be used to modulate the charging or grounding characteristics of the carryway 60 to increase or decrease the charge level. The controller 44 may also be used to control the speed of the motor 52 driving the drive sprockets to build up charge by rubbing contact with the carryway surface 60. A video display 54 may be used to monitor system operating conditions and settings or display alarm conditions. A more clearly visible or audible alarm 56 may also be used by the controller to warn of irregularities in the process. The controller may be a programmable logic controller, a laptop, a desktop, or any appropriate computer device.

The static charge potential in the conveyor belt 10 is sensed by the static-electricity detectors 24 embedded in the belt itself. Alternatively one or more fixed charge sensors 64 external to the conveyor belt may be used. There are many methods for sensing a static charge. Two of those methods are: (1) measuring the voltage potential directly; and (2) measuring the electric field set up by the charge. But any method of detecting electric charge on the conveyor belt may be used.

Figure 3:
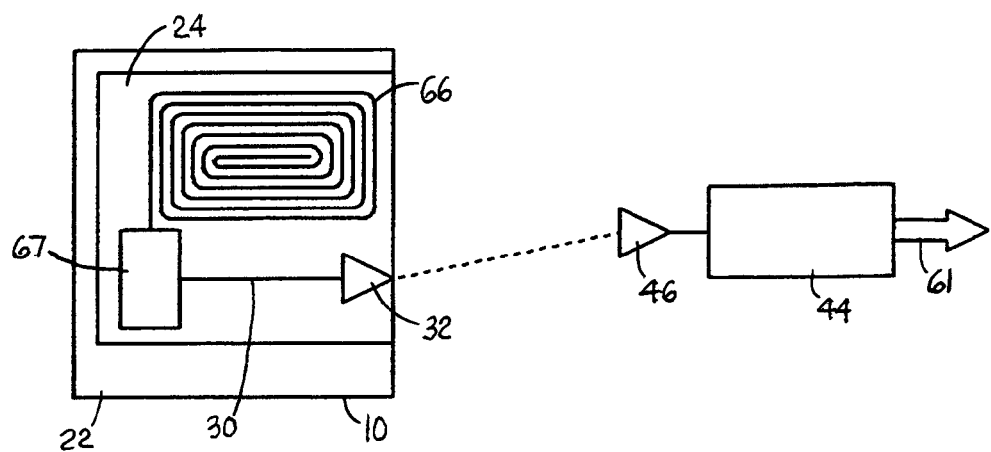
FIG. 3 is a block diagram of a version of an electric-field-sensing static-electricity detector usable in a conveyor system as in FIG. 1.

As shown in FIG. 3, the static-electricity detector 24 including a loop antenna 66 is embedded in the belt 10. The loop antenna 66 serves as a probe that picks up the electric field caused by the presence of charges on the conveying surface 22 of the belt 10 and routes its response to the field to a field measurement device 67 co-located with the antenna in the belt. The measurement is conditioned and sent to the transmitter 32 also embedded in the belt. The transmitter sends the measurement signal 30 to one or more stationary control receivers 46. The receivers send the signal to the controller 44. If additional charge potential is required, as determined by comparing the measured charge to a predetermined charge level, the controller, using control lines 61, increases charge generation by adjusting the speed of the belt over the carryway surface 60, by turning on the external secondary charge generator 26, or in other ways. Similarly, if excessive charge is sensed, the charge generation is decreased or some of the potential is dumped to ground, generally by locally or globally controlled grounding of the belt, which has been formulated to have adequate conductivity. For example, as shown in FIG. 1, the drive or idle sprockets 18, 20 could be metallic or otherwise conductive to conduct charge from the conveyor belt through their shafts 68 and selectively to a ground connection 70, either directly or through an optional resistance 73, via contacts, such as brushes 71, and a switch 72 controlled by the controller 44. Thus, the selectively grounded charge conductor formed by the metal sprockets, shaft, contact, and switch is one means for transferring electric charges from the conveying surface of the belt. Another means is a grounding strap selectively placed in contact with the belt.

Figure 4:
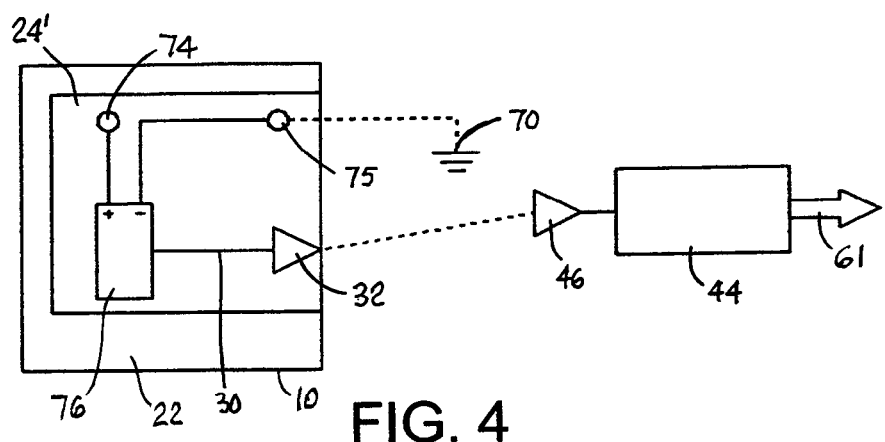
FIG. 4 is a block diagram of a version of a voltage-measuring static-electricity detector usable in a conveyor system as in FIG. 1.

FIG. 4 shows a static-electricity detector 24' that operates by measuring the voltage difference between two spaced apart locations on the conveying surface of the conveyor belt 10 or between the belt and ground 70. Two probes 74, 75 are disposed at two different locations on the belt. The potential difference between the two probes is measured by a differential-voltage detector 76. When one of the probes is connected to ground, the voltage difference is proportional to the charge on the belt. When neither probe is grounded, the voltage difference represents the voltage gradient of the belt. The measurement is conditioned and sent by the transmitter 32 to the remote receiver 46 and the controller 44, which may use the measurement to control the charge on the belt in a closed-loop system over control lines 61.

Figure 5:
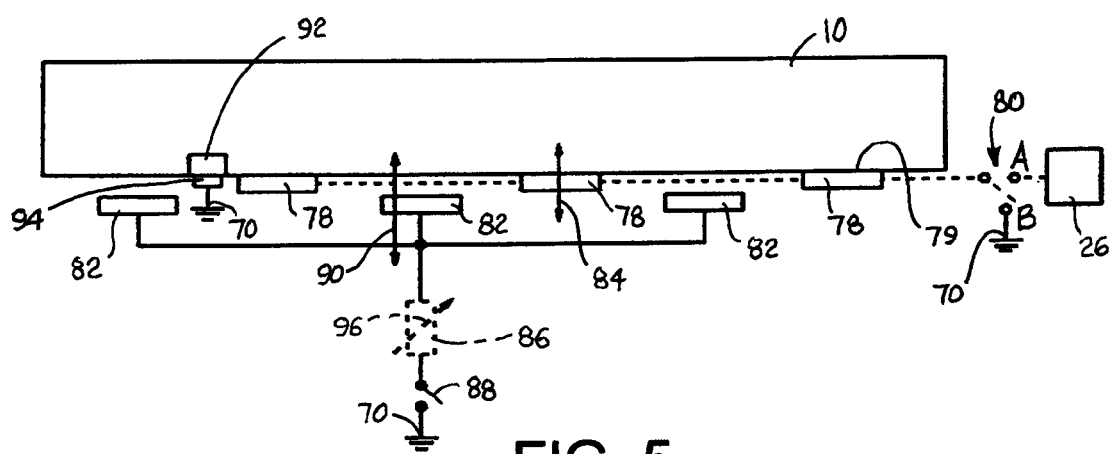
FIG. 5 is a front cross-sectional view of a conveyor system as in FIG. 1 showing alternative belt-charging and -discharging means.

FIG. 5 depicts some alternative means for transferring electric charges to or from the conveying surface of the belt 10 under the control of the controller. One means for transferring electric charge from the conveyor belt comprises using belt-supporting carryway elements 78 having rubbing surfaces 79. The carryway elements are conductive and selectively connected to ground 70 by a switch 80. The conductive carryway elements can also be used to transfer charge to the belt by connection to an electrostatic generator 26. The switch 80 can be selectively switched between throw positions A and B to modulate the charge on the belt. The switch can also have a third throw position in which the conductive carryway elements are floating to neither charge nor discharge the belt. The carryway elements 78 could also be used with a second set of belt-supporting carryway elements 82. In this version, the first set of carryway elements 78 are standard non-conductive plastic wearstrips that are selectively movable into and out of contact with the bottom of the belt 10 as indicated by two-headed arrow 84. The first set 78 could alternatively be conductive (steel or stainless, for example) or somewhat conductive (carbon-doped polymer, for example), and charge could be transferred to the belt by rubbing contact when the carryway elements are not connected to ground. The second set of carryway elements 82 are conductive and are selectively connectable as a group to ground 70, directly or via a resistance 86, by a switch 88 controlled by the controller. The second set is also movable into and out of contact with the bottom of the belt as indicated by two-headed arrow 90. The motion of each set of carryway elements is coordinated so that one set or the other is supporting the belt 10 at any given time depending on whether the belt needs to be charged or not. The belt is charged by rubbing contact with the first set of non-conductive carryway elements 78 and is discharged when supported by the grounded second set of conductive carryway elements 82. When no charging is required, the second set of conductive elements supporting the belt can be disconnected from ground. The carryway elements are moved by conventional mechanical, electromagnetic, hydraulic, or pneumatic actuators. The actuators and switches are controlled by the controller. A conductive strip 92 extending the length of the belt and contacting a grounded contact in the carryway can serve as a ground reference for ground-referenced measurements, such as the voltage measurements made with the detector of FIG. 4.

In yet another implementation, the conductive carryway elements 82 may remain in contact with the belt, but are connected to ground via a modulating resistance, as indicated by variable adjustment arrow 96 on resistance 86, or a similar device. A low resistance discharges the belt, while a high resistance impedes discharging. The controller 44 sends a signal 61 to control the modulating device and, thus, the static charge in the conveyor. In this and the previous implementation, conductive carryway elements 82 may be activated to dump electric charge to ground collectively, individually, or in sub-groups as the control scheme dictates.

In still another implementation, the charging and grounding carryway may be combined by making the rubbing surface highly or slightly conductive. The level of charge or discharge is controlled electronically by the controller by modulating the dump of electric charge from the belt to ground by selectively opening and closing the switch 88 or adjusting the variable resistance 96. In that way, the carryway surface may be controlled collectively, in groups, or individually as the control scheme dictates. Or the charge and discharge surfaces could be separate, always engaged with the belt, with the controller modulating the dump of charge through each carryway element to ground.

What is claimed is:

1. A conveyor system comprising:
   a conveyor conveying articles in a conveying direction and having a conveying surface supporting the articles being conveyed in the conveying direction;
   a static-electricity detector mounted in the conveyor and operative to make measurements of the static electricity due to the electric charge of the conveyor;
   a transmitter mounted in the conveyor;
   a receiver external to the conveyor;
   wherein the transmitter transmits the measurements received from the static-electricity detector to the receiver.

2. A conveyor system as in claim 1 wherein the static-electricity detector includes a probe mounted in the conveyor and connected to the static-electricity detector, wherein the probe responds to the static electricity on the conveying surface and sends a response to the static-electricity detector.

3. A conveyor system as in claim 2 wherein the probe responds to the electric field formed by the electric charge of the conveyor.

4. A conveyor system as in claim 2 wherein the probe responds to the voltage at the conveying surface caused by the electric charge.

5. A conveyor system as in claim 1 further comprising means for transferring electric charge to the conveying surface.

6. A conveyor system as in claim 5 wherein the means for transferring electric charge to the conveying surface comprises a stationary electrostatic generator contacting the conveyor.

7. A conveyor system as in claim 5 wherein the means for transferring electric charge to the conveying surface comprises a stationary rubbing surface that the conveyor engages in rubbing contact while advancing.

8. A conveyor system as in claim 7 wherein the rubbing surface is made of a first material and the conveyor is made of a second material and wherein the first and second materials are selected to charge the conveying surface to a preselected level.

9. A conveyor system as in claim 8 wherein the first and second materials are the same.

10. A conveyor system as in claim 8 wherein the first and second materials are different.

11. A conveyor system as in claim 7 further comprising an electrostatic generator and wherein the stationary rubbing surface is conductive and selectively connected to the electrostatic generator to charge the conveyor or to ground to discharge the conveyor.

12. A conveyor system as in claim 1 further comprising a grounded charge conductor contacting the conveyor to conduct electric charges from the conveying surface to ground.

13. A conveyor system as in claim 1 further comprising a first set of ungrounded rubbing surfaces movable into and out of contact with the conveyor and a second set of grounded, conductive rubbing surfaces movable into and out of contact with the conveyor.

14. A conveyor system as in claim 1 further comprising a conductive rubbing surface contacting the conveyor by modulating the grounding of the rubbing surface.

15. A conveyor system as in claim 14 further comprising a switch connected between the conductive rubbing surface and ground, wherein the switch is modulated open and closed to control the level of charge on the conveyor.

16. A conveyor system as in claim 14 further comprising a variable resistance connected between the conductive rubbing surface and ground, wherein the resistance is modulated to control the level of charge on the conveyor.

17. A conveyor system as in claim 1 further comprising a charge control system in contact with the conveyor to transfer electric charges to or from the conveying surface as a function of the measurements and a predetermined electric charge level.

18. A conveyor system as in claim 17 wherein the charge control system comprises a controller processing the measurements and means for transferring electric charge to the conveying surface, wherein the controller controls the means for transferring charge to the conveying surface to transfer charge as needed.

19. A conveyor system as in claim 17 wherein the charge control system comprises a controller processing the measurements and a charge conductor contacting the conveyor, wherein the controller controls the charge conductor to conduct electric charges from the conveying surface as needed.

20. A conveyor belt comprising:
    a conveying surface for supporting articles;
    a static-electricity detector operative to make measurements of the static electricity due to electric charges on the conveying surface;
    a transmitter mounted in the conveyor belt to transmit the measurements received from the static-electricity detector.

21. A conveyor belt comprising:
    a conveying surface for supporting articles;
    a static-electricity detector operative to make measurements of the static electricity due to electric charges on the conveying surface;
    wherein the static-electricity detector includes a probe mounted in the conveyor belt and connected to the static-electricity detector, wherein the probe responds to the static electricity on the conveying surface and sends a response to the static-electricity detector.

22. A conveyor belt as in claim 21 wherein the probe responds to the electric field formed by electric charges on the conveying surface.

23. A conveyor belt as in claim 21 wherein the probe responds to the voltage at the conveying surface caused by electric charges.

24. A conveyor belt as in claim 20 further comprising a conductive strip extending along the length of the conveyor belt.

25. A method for controlling the amount of charge on a conveyor, comprising:
  making measurements of the amount of electric charge on a conveyor;
  transmitting the measurements from a transmitter on the conveyor to an external receiver;
  transferring electric charges to or from the conveyor as a function of the measurements.

26. The method of claim 25 comprising making measurements of the amount of electric charge by measuring an electric field formed by the electric charge.

27. The method of claim 25 comprising making measurements of the amount of electric charge by measuring a voltage on the conveyor caused by the electric charge.

28. The method of claim 25 comprising transferring electric charges to the conveyor by rubbing the conveyor against a rubbing surface.

29. The method of claim 25 comprising transferring electric charges to the conveyor from an electrostatic generator.

30. The method of claim 25 comprising transferring electric charges from the conveyor by selectively grounding the conveyor.

31. The method of claim 25 comprising transferring electric charges from the conveyor by modulating the resistance between the conveyor and ground.

* * * * *